United States Patent
Chu et al.

(10) Patent No.: US 6,787,418 B2
(45) Date of Patent: Sep. 7, 2004

(54) METHOD OF MAKING THE SELECTION GATE IN A SPLIT-GATE FLASH EEPROM CELL AND ITS STRUCTURE

(75) Inventors: Wen-Ting Chu, Kaohsiung (TW); Jack Yeh, Chu Pei (TW); Chrong-Jung Lin, Taipei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/355,134

(22) Filed: Jan. 31, 2003

(65) Prior Publication Data

US 2003/0157770 A1 Aug. 21, 2003

(30) Foreign Application Priority Data

Feb. 6, 2002 (TW) .......................... 91102132 A

(51) Int. Cl.⁷ .............................. H01L 21/336
(52) U.S. Cl. ........................ 438/259; 438/267
(58) Field of Search ..................... 438/257–267, 438/701, 713, FOR 203, FOR 458; 257/314–320, E29.129, E21.179, E21.68

(56) References Cited

U.S. PATENT DOCUMENTS

| | | | |
|---|---|---|---|
| 5,284,784 A | * | 2/1994 | Manley ...................... 438/263 |
| 5,312,781 A | * | 5/1994 | Gregor et al. ............... 438/701 |
| 5,998,263 A | * | 12/1999 | Sekariapuram et al. ..... 438/259 |
| 6,133,098 A | * | 10/2000 | Ogura et al. ................. 438/267 |
| 6,531,347 B1 | * | 3/2003 | Huster et al. ................ 438/164 |
| 6,593,187 B1 | * | 7/2003 | Hsieh .......................... 438/257 |
| 2002/0011608 A1 | * | 1/2002 | Lee ............................. 257/200 |
| 2003/0139010 A1 | * | 7/2003 | Wang .......................... 438/257 |

FOREIGN PATENT DOCUMENTS

EP 335395 A2 * 10/1989 ........... G11C/17/00

* cited by examiner

Primary Examiner—George Fourson
Assistant Examiner—Brook Kebede

(57) ABSTRACT

A method of making the selection gate in a split-gate flash EEPROM cell forms a selection gate on a trench sidewall of a semiconductor substrate to minimize the sidewise dimension of the selection gate and to maintain the channel length. The disclosed method includes the steps of: forming a trench on a semiconductor substrate on one side of a suspending gate structure; forming an inter polysilicon dielectric layer on the sidewall of the suspending gate structure and the trench; and forming a polysilicon spacer on the inter polysilicon dielectric layer as the selection gate. Such a split-gate flash EEPROM cell can produce ballistic hot electrons, improving the data writing efficiency and lowering the writing voltage.

6 Claims, 3 Drawing Sheets

METHOD OF MAKING THE SELECTION GATE IN A SPLIT-GATE FLASH EEPROM CELL AND ITS STRUCTURE

BACKGROUND OF THE INVENTION

1. Field of Invention

The invention relates to a semiconductor device and the associated manufacturing process. In particular, it relates to a manufacturing method of the selection gate in a split-gate flash EEPROM cell.

2. Related Art

Typically, the data storage media in computers can be separated into volatile and nonvolatile memory. The volatile memory includes the dynamic random access memory (DRAM) and static random access memory (SDRAM). Since the data stored in such memory will disappear immediately after the power supply is interrupted, it is mainly used in temporary data input/output (I/O). The nonvolatile memory can keep the stored data even after the power supply is turned off. Therefore, such memory can be used in various occasions. The nonvolatile memory can be divided according to the access method into mask read only memory (ROM), erasable programmable read only memory (EPROM), electric erasable programmable read only memory (EEPROM), and flash EEPROM.

Since the introduction of the 256K flash EEPROM in 1987, it has gradually become the mainstream of nonvolatile memory. The flash EEPROM is a type of high-density memory that combines the advantages of EPROM and EEPROM. It has the merits of being nonvolatile, rewriteable, high-density, and long-lasting. Therefore, it is ideal for applications in portable computers and telecommunications. Some scholars even predict that the flash EEPROM will start the next semiconductor evolution. We thus see the importance of the flash EEPROM in the semiconductor industry.

Normally, the flash EEPROM can be divided according to the structure into split-gate and stack-gate ones. The data erasing speed of the split-gate flash EEPROM is faster than that of the stack-gate ones. Therefore, the semiconductor industry favors the former. In general, the structure of the split-gate flash EEPROM cell includes: a suspending gate consisted of a gate oxide/polysilicon/oxide structure, a control gate/selection gate, and an inter polysilicon dielectric layer between the suspending gate and the control gate/selection gate. It is called the suspending gate structure because its polysilicon layer does not have any electrical communications with any electrode. The data erasing and writing actions in the flash EEPROM can be achieved by imposing different voltage combinations on the gate, source, drain, and substrate, injecting or moving out electrons from the suspending gate. In order for the split-gate flash EEPROM to operate correctly, the selection ate has to at least cover the distance between the drain (or source) and the suspending gate. That is, an appropriate distance has to be maintained between the drain or source and the suspending gate as the electron channel. If the channel length is too short, short channel effects may happen; while if the channel length is too long, the writing efficiency will be bad.

With the increase in the semiconductor integration, the device sizes have been shrunk down to submicron or deep submicron (<0.35 μm) scales. However, normal operations of the flash EEPROM require an appropriate channel length. Therefore, there is some difficulty in making submicron-scale split-gate flash EEPROM. A new split-gate flash EEPROM structure that allows for a certain channel length in the submicron scales is required.

SUMMARY OF THE INVENTION

In view of the foregoing, the invention provides a manufacturing method of the selection gate in a flash EEPROM cell. A selection gate is formed on the trench sidewall of a semiconductor substrate to minimize the sidewise dimension of the selection gate and to maintain an appropriate channel length.

An objective of the invention is to provide a method for making the selection gate of a split-gate flash EEPROM cell. This method is applied to a semiconductor substrate. The semiconductor substrate is formed with a suspending gate structure consisted of at least a gate oxide/polysilicon/first oxide, and a source region. The method includes the following steps. Form a trench on a semiconductor substrate on one side of the suspending gate structure, where the trench is opposite to the source region. Form an inter polysilicon dielectric layer on the sidewall of the suspending gate structure and the trench. Forming a polysilicon spacer on the inter polysilicon dielectric layer as the selection gate. Finally, form a drain region in the trench on the semiconductor substrate.

Another objective of the invention is to provide a manufacturing method of a split-gate flash EEPROM. The method includes the following steps. Form a gate oxide layer on a semiconductor substrate. Form a polysilicon layer on the gate oxide layer. Form a silicon nitride layer on the polysilicon layer. Form a trench in the silicon nitride layer and expose part of the upper surface of the polysilicon layer, thereby defining a suspending gate region. Form a first oxide layer in the trench. Form a common source plug between two adjacent suspending gate regions. Perform an etching process to remove the silicon nitride layer and the polysilicon layer and the gate oxide layer that are not covered by the first oxide layer, forming a suspending gate structure. Form a substrate trench in the semiconductor substrate on one side of the suspending gate structure. The substrate trench is opposite to the common source plug. Form an inter polysilicon dielectric layer on the sidewall of the suspending gate structure and the substrate trench. Form a polysilicon spacer on the sidewall of the polysilicon dielectric layer as a selection gate. Finally, form a drain in the trench on the semiconductor substrate.

A further objective of the invention is to provide a split-gate flash EEPROM cell structure. The structure includes: a suspending gate structure, an inter polysilicon dielectric layer, a polysilicon spacer, a drain, and a source. The suspending gate structure is formed on a semiconductor substrate and stacked from bottom to top a gate oxide layer, a polysilicon layer, and a first oxide layer. A trench is formed on one side of the suspending gate structure in the semiconductor substrate. The inter polysilicon dielectric layer is formed on the sidewall of the suspending gate structure and the trench. The polysilicon spacer is formed on the sidewall of the polysilicon dielectric later as a selection gate. The drain is formed in the trench next to the selection gate. The source is formed on the semiconductor substrate opposite to the trench.

Not only can the disclosed split-gate flash EEPROM structure effectively reduce the sidewise dimension of the selection gate while maintaining an appropriate channel length, hot ballistic electrons are produced to go along the selection gate channel on the sidewall of the semiconductor substrate trench to the suspending gate. This can improve the data writing efficiency and lower the writing voltage. Therefore, the invention achieves the goal of a high access speed and low power consumption for the split-gate flash EEPROM manufactured in a deep submicron process.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

The invention discloses a split-gate flash EEPROM cell structure and the associated manufacturing method. The selection gate of the split-gate flash EEPROM is formed on the sidewall of a semiconductor substrate trench, using the trench sidewall as the selection gate channel. The invention can maintain an appropriate channel length while minimizing the sidewise dimension of the selection gate. Such a channel structure can produce ballistic hot electrons to improve the data writing efficiency and to lower the writing voltage.

Figure 1:
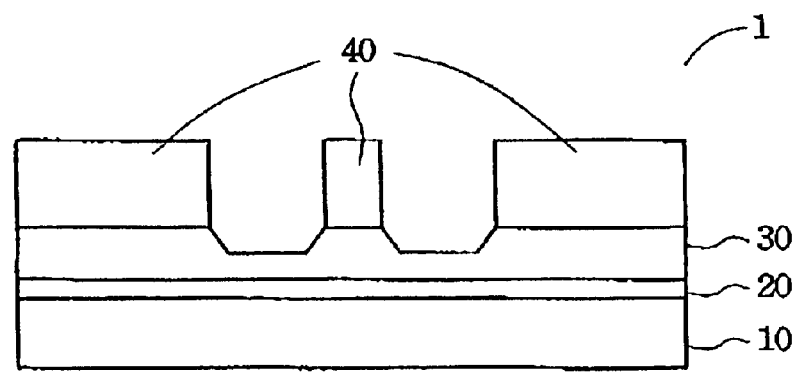
FIGS. 1 to 6 are schematic cross-sectional views of the disclosed split-gate flash EEPROM cell.

FIG. 1 shows the initial structure for making the disclosed split-gate flash EEPROM cell. As shown in the drawing, the memory cell 1 contains a semiconductor substrate 10, a gate oxide layer 20, a polysilicon layer 30, and a silicon nitride layer 40. Preferably, the substrate 10 can be a single crystal semiconductor material with the <100> crystalline direction. The gate oxide layer 20 is an oxide layer with thickness between 50 Å and 150 Å is formed on the substrate 10 using a high-temperature oxidation method at a temperature between 800° C. and 1000° C. The gate oxide layer 20 can also be formed using the conventional chemical vapor deposition (CVD) method. The polysilicon layer 30 can be formed on the gate oxide layer 20 using the low-pressure chemical vapor deposition (LPCVD) or other appropriate method known in the prior art. The polysilicon layer 30 can be simultaneously doped with polysilicon to form a conductor with thickness between 300 Å and 3000 Å. Since the polysilicon layer 30 is not connected to any other conductor, it is thus called a suspending gate. It can be used to store charges. The silicon nitride layer 40 can be deposited on the polysilicon layer 30 using the LPCVD and has thickness between 500 Å and 5000 Å.

Afterwards, a first photo resist layer (not shown) is formed on the silicon nitride layer 40 to define a suspending gate region. A dry etching process is then performed to remove the silicon nitride layer 40 not covered by the first photo resist layer until the polysilicon layer 30 is exposed. Another etching process is performed to form two acute structures on the top surface of the exposed polysilicon layer 30. Finally, the first photo resist layer is removed.

Figure 2:
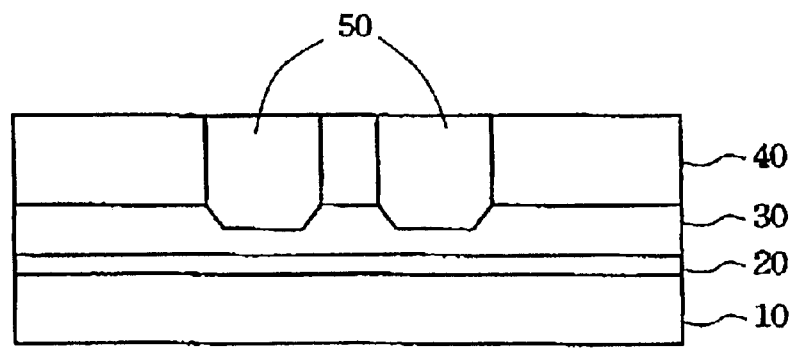

With reference to FIG. 2, a first oxide layer 50 is formed on the exposed polysilicon layer 30 using the CVD. A back-etching or chemical mechanical polishing (CMP) process is performed so that the upper surfaces of the silicon nitride layer 40 and the first oxide layer 50 are coplanar.

Figure 3:
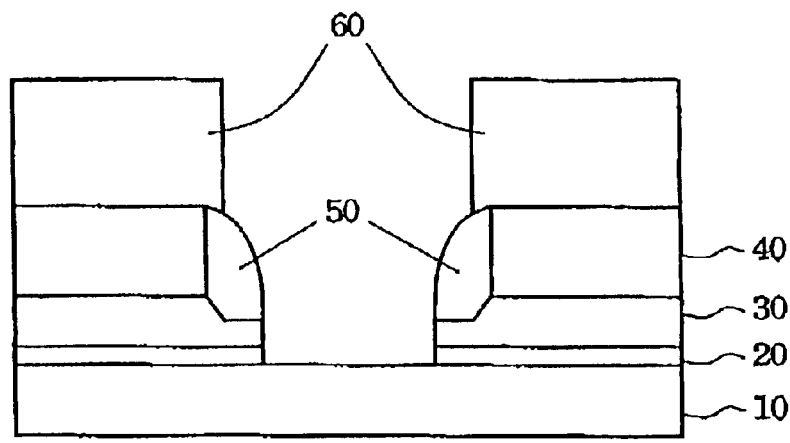

With reference to FIG. 3, a second photo resist layer 60 is formed on the silicon nitride layer 40 to define a common source region. An etching process is performed to remove the silicon nitride layer 40, the first oxide layer 50, the polysilicon layer 30, and the gate oxide layer 20 not covered by the second photo resist layer 60, until part of the substrate surface 10 is exposed. The etching process of all the layers can be as follows: using hot phosphoric acids to remove the silicon nitride layer 40, using dip wet etching to remove the first oxide layer, using a chlorine-rich plasma etchant to remove the polysilicon layer 30, and using $CF_x$-rich plasma to perform dry etching on the gate oxide layer 20. Afterwards, an ion implantation process is performed to form a common source region in the exposed substrate 10. The dopant used to form the common source region depends upon the material of the substrate 10. For example, if the substrate 10 is a p-type material, an n-type dopant (such as phosphor) is used to form the common source region. If the substrate 10 is an n-type material, a p-type dopant (such as boron) is used. Finally, the second photo resist layer 60 is removed.

Figure 4:
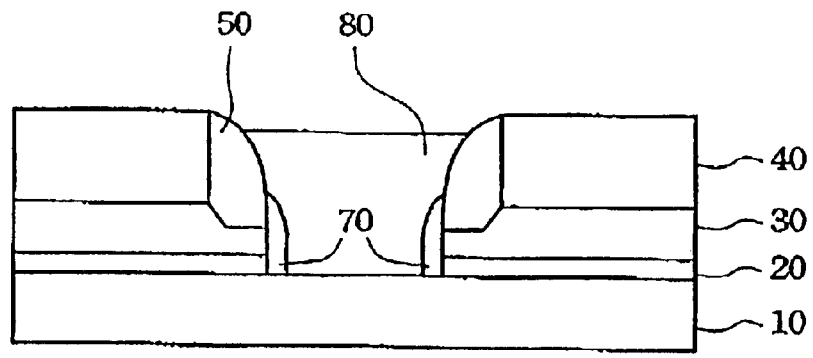

As shown in FIG. 4, an oxide layer is deposited on the surface of the common source region using the CVD. The oxide layer is then etched to form a common source region spacer 70. The spacer 70 covers part of the sidewalls of the first oxide layer 50, the polysilicon layer 30, and the gate oxide layer 20 to separate the suspending gates of two adjacent memory cells. Afterwards, another polysilicon layer is deposited on the common source region spacer 70 and the common source region to form a polysilicon plug 80. A back-etching or CMP process is performed with the silicon nitride layer 40 as the stop layer.

Figure 5:
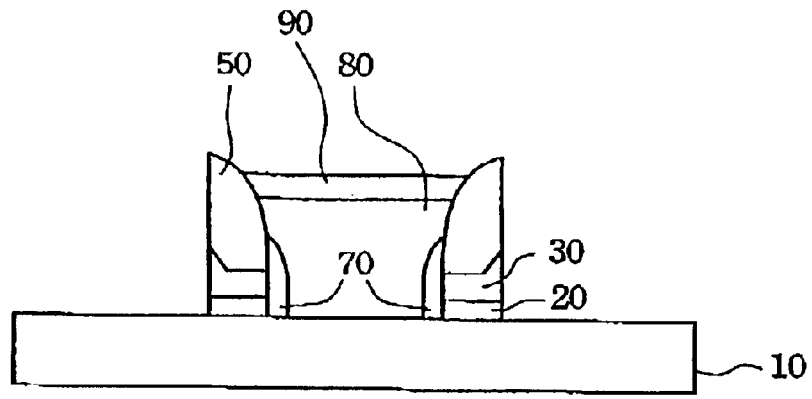

With reference to FIG. 5, a second oxide layer 90 is formed on the common source plug 80 using the thermal oxidation method. A dry or wet etching method is used to remove the silicon nitride layer 40. An etching process is performed on the polysilicon layer 30 and the gate oxide layer 20 using the first oxide layer 50 and the second oxide layer 90 as the hard masks, until the substrate surface 10 is exposed. This completes the fabrication of the suspending gate structure and the common source plug.

Figure 6:
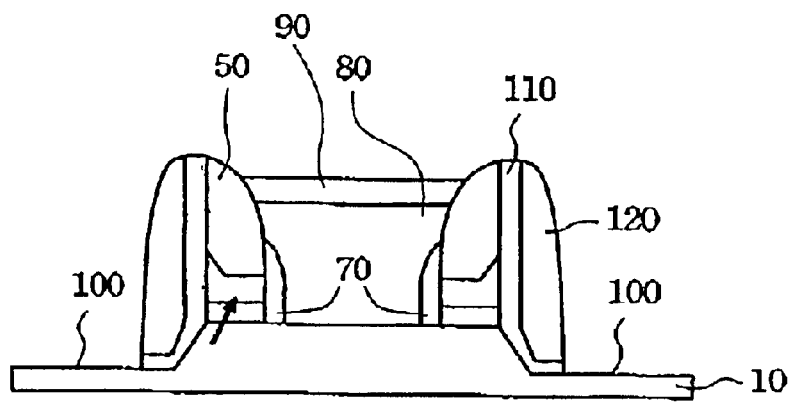

As shown in FIG. 6, the first ad second oxide layers 50, 90 in the suspending gate structure made in FIGS. 1 through 5 are taken as the hard masks for etching the substrate 10. Several substrate trenches 100 are thus formed on both sides of the suspending gate structure. For example, one can use $Cl_2$, HBr, $SF_6$, or $SiCl_4$ as the etchant plasma to perform dry etching on the substrate 10. The substrate trenches 100 have a slant sidewall adjacent to the suspending gate structure. The depth of the trench and the slope of the sidewall can be determined according to the needs. An inter polysilicon dielectric layer 110 is deposited on the sidewall surface of the suspending gate structure and the suspending substrate trench 100 using the LPCVD method. The inter polysilicon dielectric layer 110 functions as an insulation between the suspending gates and the control gate/selection gate in the split-gate flash EEPROM cell. Therefore, it can use a compound silicon oxide/silicon nitride or silicon oxide/silicon nitride/silicon oxide (ONO) layer structure that has a better dielectric property. Afterwards, another polysilicon layer is deposited on the inter polysilicon dielectric layer 110. An etching process is then performed to form a polysilicon spacer 120 on the sidewall of the inter polysilicon dielectric layer 110. The polysilicon spacer 120 is the selection gate for the split-gate flash EEPROM cell. The polysilicon spacer 120 can be formed using the conventional CVD or other appropriate methods. Its thickness is preferably between 500 Å and 3000 Å. The second polysilicon layer can be simultaneously doped with polysilicon to form a conductor. The second polysilicon can be doped with polysilicon and tungsten silicide to form a polysilicon metal. Such a material is one of the most commonly used gate conductor materials. Afterwards, a conventional ion implantation or diffusion method can be employed to dope impurities in the substrate trench 100 to form a drain region. It is preferably to use the same dopant in the drain and the source. The choice of the dopant is determined by the material of the semiconductor substrate 10. This then completes the fabrication of the split-gate flash EEPROM cell.

Figure 7:
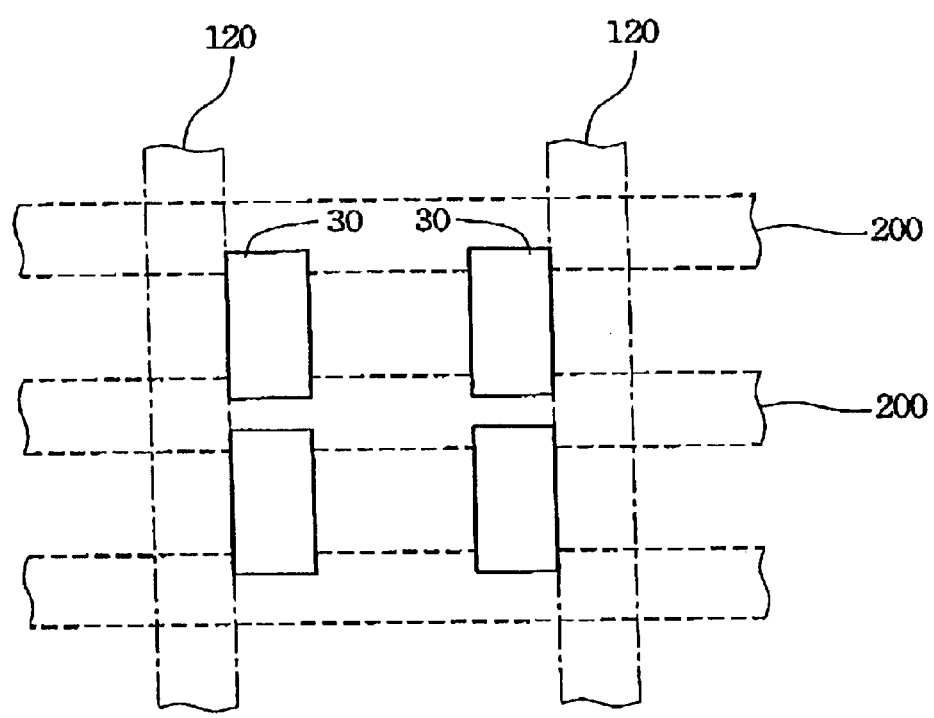
FIG. 7 is a local view of a layout using the disclosed split-gate flash EEPROM cell array.

FIG. 7 shows several split-gate flash EEPROM cells and isolation areas 200 to separate the adjacent memory cells. The isolation area 200 can be formed by etching several trenches in the semiconductor substrate 10 and then filling in the trenches silicon dioxide and polysilicon, forming shallow trench isolations (STI). Alternatively, they can be formed using the local oxidation (LOCOS) method, too. To make the drawing explicit, we only draw the structure of the memory cell array.

Typically, the data writing of the split-gate EEPROM cell is achieved by imposing appropriate voltages among the drain, the source, and the polysilicon layer (selection gate) to inject electrons into the suspending gate formed from the polysilicon layer. Under a strong electric field, the hot electrons bombard the silicon atoms and scatter, penetrating the gate oxide layer and entering the suspending gate. The data erasing of the memory cell is achieved by changing the voltages among the drain, the source, and the polysilicon layer (selection gate). The electrons move from the suspending gate out of the sidewall dielectric layer into the selection gate formed from the polysilicon layer. Since the hot electrons in the channel have scatterings and enter the suspending gate to achieve data writing, therefore sufficient large voltages have to be imposed. In the disclosed split-gate flash EEPROM cell structure, the selection gate is formed on the sidewall of the substrate trench, the sidewise dimension of the selection gate is shrunk and the same channel length is preserved. Thus, when appropriate voltages are imposed on the drain, the source, and the selection gate for data writing, the hot electrons are directly ejected to the suspending gate along the sidewall channel of the substrate trench, as shown by the arrow in FIG. 6. This way of directly injecting hot electrons from the drain/source to the suspending gate is called the ballistic hot electron injection. The writing efficiency is better than the conventional method that injects hot electrons via scattering. This method can lower the voltages imposed among the drain, the source, and the selection gate.

In summary, the invention disclosed a split-gate flash EEPROM cell structure and the associated manufacturing method. The trench sidewall of a semiconductor substrate is formed with a selection gate to minimize the size of the flash EEPROM cell while keeping its channel length. When appropriate voltages are imposed on the drain, the source, and the selection gate, ballistic hot electrons are injected along the channel of the trench sidewall to the suspending gate. In comparison with the conventional method that hot electrons move along the horizontal direction and enter the suspending gate via scattering, the disclosed flash EEPROM has a better writing efficiency and a lower writing voltage.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for manufacturing a selection gate of a split-gate flash EEPROM cell of which a suspending gate structure having at least a gate oxide/polysilicon/first oxide and a source is formed on a semiconductor substrate, the method comprising the steps of:

forming a trench in the semiconductor substrate on one side of the suspending gate structure, the trench being located opposite to the source and the sidewall of the trench adjacent to the suspending gate structure being a slant sidewall;

forming an inter polysilicon dielectric layer on the sidewall of the suspending gate structure and the trench;

forming a polysilicon spacer on the sidewall of the inter polysilicon dielectric layer as the selection gate; and forming a drain on the semiconductor substrate in the trench, the drain being adjacent to the selection gate.

2. The method of claim 1, wherein the step of forming the trench includes using the first oxide layer of the suspending gate structure as a hard mask to perform an etching process on the semiconductor substrate.

3. The method of claim 2, wherein the etching process is an anisotropic etching.

4. The method of claim 1, wherein the step of forming the inter polysilicon dielectric layer employs the chemical vapor deposition (CVD) method.

5. The method of claim 1, wherein the inter polysilicon dielectric layer includes a multi-layer dielectric structure consisted of silicon oxide/silicon nitride/silicon oxide (ONO).

6. The method of claim 1, wherein the step of forming the polysilicon spacer employs the CVD method.

* * * * *